United States Patent [19]

Sato

[11] 3,944,829

[45] Mar. 16, 1976

[54] METHOD AND APPARATUS FOR PROCESSING A VIDEO SIGNAL FROM A SCANNING ELECTRON MICROSCOPE

[75] Inventor: Masayuki Sato, Akishima, Japan

[73] Assignee: Nihon Denshi Kabushiki Kaisha, Tokyo, Japan

[22] Filed: Mar. 26, 1974

[21] Appl. No.: 454,808

[30] Foreign Application Priority Data
Mar. 27, 1973 Japan.............................. 48-35285

[52] U.S. Cl................................ 250/311; 178/6.8
[51] Int. Cl.²........................................ H01K 37/26
[58] Field of Search ......... 178/6.8, DIG. 2; 250/306, 250/307, 311, 310

[56] References Cited
UNITED STATES PATENTS
3,549,883  12/1970  Morris et al. ....................... 250/311
3,614,311  10/1971  Fujiyasu et al........................ 178/6.8
3,783,281  1/1974  Crewe................................. 250/307
3,829,691  8/1974  Hufnagel............................. 250/311

Primary Examiner—Archie R. Borchelt
Assistant Examiner—D. C. Nelms
Attorney, Agent, or Firm—Webb, Burden, Robinson & Webb

[57] ABSTRACT

A scanning electron microscope for displaying a scanning image utilizing a time distributed pulsed video signal. The low frequency noises in the pulsed signal are deleted according to the occurrence of sudden pulse intensity variation between adjacent video pulse signals.

1 Claim, 7 Drawing Figures

METHOD AND APPARATUS FOR PROCESSING A VIDEO SIGNAL FROM A SCANNING ELECTRON MICROSCOPE

This invention relates to a video signal processing method and apparatus used in a system which detects information possessing a two-dimensional distribution as a time distribution signal, said detected signal being displayed on an image display means as a two-dimensional distribution.

In a scanning electron microscope, the generated electron beam irradiates and simultaneously scans a specimen two-dimensionally. The secondary electrons, etc. emitted from inpingement are detected and fed into a display means as a brightness modulation signal in order to display a brightness modulation image of the specimen surface in synchronism with said electron beam scanning speed. The magnification of the specimen image displayed on the cathode-ray tube of a scanning electron microscope as above described is determined by the ratio of the scanning width of the electron beam irradiating the specimen and the effective width of the cathode ray tube. However, if the scanning width is decreased so as to increase the magnification, the specimen image will become blurred and therefore useless. The threshhold value is determined by the cross section of the electron beam irradiating the specimen, the beam current intensity and the quantity of secondary electrons detected by the detector. The S/N ratio at the threshhold value is extremely low, the improvement of which is directly related to specimen image resolution enhancement.

The video signal noise component can be broadly classified into two types. One is signal noise attributable to the statistical fluctuation of the detection signal and can be minimized by increasing the beam intensity or scanning time, i.e. the signal detection time. The other is electrical noise generated in the detection signal amplification circuit which cannot be reduced, by prolonging the signal detecting time as in the case of the noise attributable to the aforementioned statistical fluctuation. The above matters, facts and phenomena apply not only to scanning electron microscopes but also to all types of electronic equipment utilizing video signals.

There are various ways and means for removing the noise component contained in a video signal. Most of these ways and means, however, are unable to produce a video image at the same time as a signal is detected since the necessary video signal information which orginates from the temporarily stored video signals is compared or calculated mathematically; moreover, bulky and expensive equipment is required for storing and memorizing a large amount of video signal information.

An object of the invention is to eliminate the demerits of the prior art by providing a simple processing apparatus which, in addition to eliminating the video signal noise component at the time the signal is detected, minimizes the statistical fluctuation of said video signal.

Other objects and advantages of this invention will become more readily apparent by reading through the following detailed description in conjunction with the accompanying drawings of which;

Figure 1:
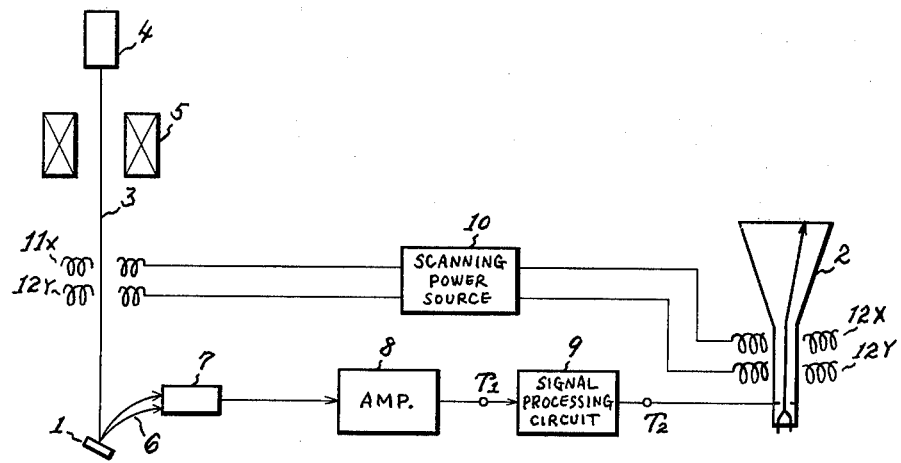
FIG. 1 is a schematic diagram showing a scanning electron microscope.

FIG. 1 is a schematic diagram showing the structure of a scanning electron microscope which indicates more specifically the principle of displaying the image of a specimen 1 on the screen of a cathode ray tube 2. In the figure, an electron beam 3 generated by an electron gun 4 is focused on the specimen 1 by a condenser lens 5. Secondary electrons and the like 6 emitted from the specimen due to the inpingement of the electron beam 3 are detected by a detector 7, the output signal of which is amplified by a video signal amplifier 8 and passed through a signal processing circuit 9. The processing circuit 9 is of a design and has a processing method according to this invention. The output of the processing circuit is applied to the brightness modulation grid of a cathode ray tube 2.

In the meantime, a scanning power source 10 supplied current to deflecting coils 11X and 11Y and 12X and 12Y so that the electron beam 3 irradiating the specimen 1 two-dimensionally scans said specimen surface in synchronism with the beam scanning the screen of the cathode ray tube 2.

Figure 2:
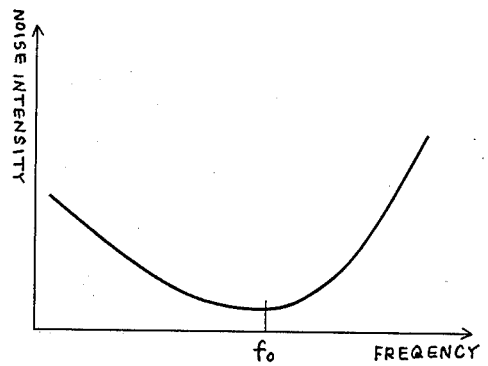
FIG. 2 is a graphical representation showing the characteristics of the noise component generated by a video signal amplifier.

FIG. 2 shows the characteristics of the noise component generated by a video signal amplifier 8 or the like. In the figure, the abscissa represents the frequency f and the ordinate represents the intensity of the noise signal (e.g. $\mu$ volt $/\sqrt{f}$). The noise at the high frequency side $(f > f_o)$ is referred to as "white noise" and the noise at the low frequency side $(f < f_o)$ is referred to as "$1/f$ noise." The frequency characteristics of the amplifier can be optionally preset, depending upon the operational requirements of the amplifier, and the amplitude for a frequency over a certain level (for example $f_0$ in FIG. 1) can be reduced to almost zero with the aid of a low pass filter or the like, thereby eradicating the effect of the white noise. And by adjusting the scanning speed or beam current intensity of the electron beam, etc., which decides the operational requirements of the amplifier, a certain upper limit frequency $f'$ of the video signal to be amplified can be equalized with said frequency $f_0$ of the amplifier characteristics. In this way, the white noise can be eradicated but the $1/f$ noise cannot be eradicated because, in the case of a video amplifier, a low frequency signal cannot be cut off and even a d.c. signal must be amplified. Consequently, this $1/f$ noise results in an image dotted with high bright spot. A feature of this invention is to eradicate the low frequency noise component of the video signal without using a large capacity signal memory unit.

Figure 3:
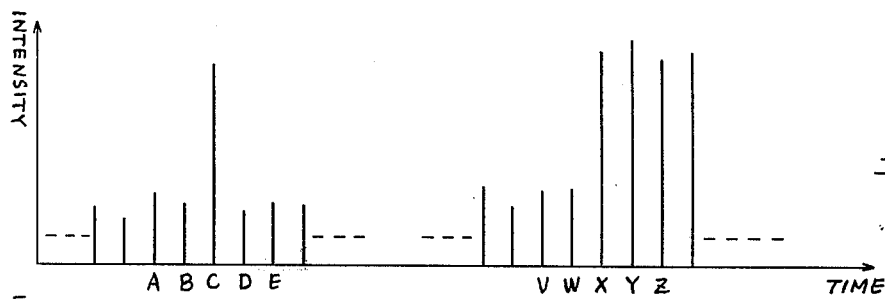
FIG. 3 is a chart of a video signal applied to a processing circuit according to this invention.

The input signal of the video signal processing means according to this invention must be pulsed. And, in the embodiment of FIG. 1, when the intensity of the secondary electrons emitted from the specimen 1 is very weak or the electron beam 3 scans over the specimen 1 in a digital mode, the output signal of the detector 7 is pulsed as shown in FIG. 3. In FIG. 3, the abscissa indicates the time and the ordinate indicates the image signal intensity. As mentioned above, the video signal passing through the video signal amplifier 8 can get rid of a high frequency noise by selecting the scanning speed of the electron beam 3 and the frequency characteristic of the amplifier 8 properly, but a comparatively large noise of a low frequency as C in FIG. 3 cannot be prevented. Such a low frequency noise is subjected to a sudden variation compared with the intensity of the adjacent video signal pulses and successive noise can rarely occur. This noise appears as a brilliant point on a specimen image, which can deteriorate a specimen image and the resolution of the image. In the series of video signal pulses indicated by V~ Z in the figure, abrupt variations are noted between W and X. But since these abrupt variations are not successive, it can be assumed that video signal pulses instead of noise are the varying signal.

Figure 4:
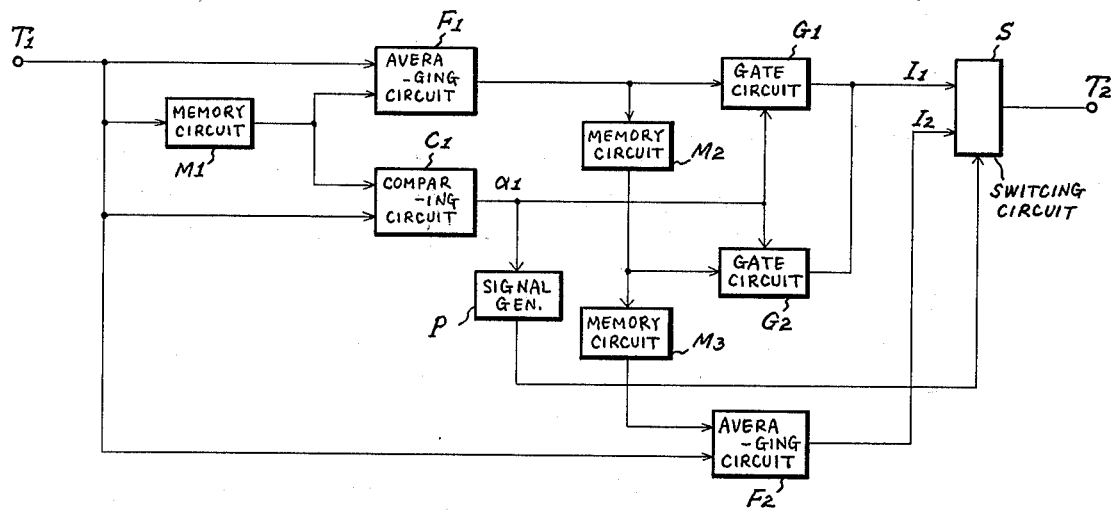
FIG. 4 is a block diagram of a processing circuit according to this invention.

A circuit 9 in FIG. 1 is designed for eliminating the abovementioned low frequency noise and minimizing a micro fluctuation of video signals. FIG. 4 is a schematic diagram showing its structure. In the figure, $M_1$, $M_2$ and $M_3$ are memory circuits for memorizing one input signal pulse intensity (pulse height) and they memorize a new signal when the new signal is applied to the input. $F_1$ and $F_2$ represent averaging circuits for generating the output pulses whose intensity is equal to the mean intensity of the input signal pulses applied to two input terminals. $C_1$ denotes a comparing circuit for generating an output signal $\alpha_1$ only when the difference in intensity between the two input pulses impressed on the two input terminals is larger than a preset value. $G_1$ denotes a gate circuit which is turned "closed" when the signal $\alpha_1$ from the comparing circuit is impressed and is turned "open" on the other occasions. On the contrary, $G_2$ is a gate circuit which is turned "open" when the input signal $\alpha_1$ is impressed and is turned "closed" on other occasions. A signal generator P generates a signal for controlling a switching circuit S so as to connect input $I_2$ of the switching circuit S to the output terminal $T_2$ only when the output signal $\alpha_1$ from the comparing circuit $C_1$ is impressed twice in succession, and so as to connect the input $I_1$ to the output of $T_2$ when a signal from a circuit P is not impressed.

If image signal pulses A to E as shown in FIG. 3 are impressed on a terminal $T_1$ in FIG. 4 then four pairs of consecutive signal pulses A-B, B-C, C-D, and D-F generated, are averaged by the averaging circuit $F_1$. Comparing circuit $C_1$ compares the intensity of said pairs of pulse signals to see whether the difference in intensity is higher than a specified value. In the case of input signals A-B and D-E, an output signal $\alpha_1$ is not generated from the comparing circuit $C_1$ and the output signal of the circuit $F_1$ reaches an output terminal $T_2$ through a gate circuit $G_1$ and a switching circuit S.

Figure 5:
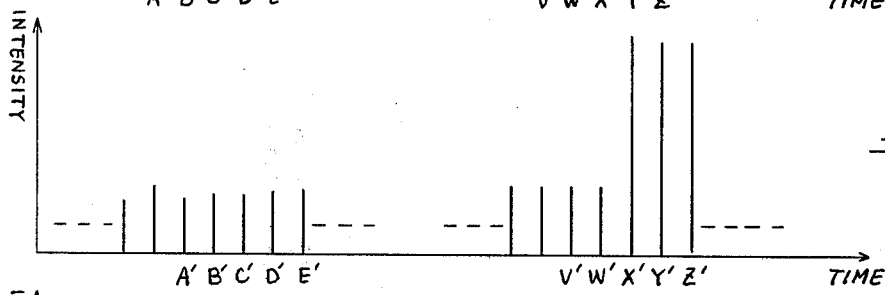
FIG. 5 is a chart of a video signal processed by the circuit shown in FIG. 4.

In the case of input pulse signals B-C and C-D, however, the difference in intensity is so large that two consecutive output signals $\alpha_1$ are generated from the comparing circuit. Successively, since the gate circuit $G_1$ is turned "off" when the pulse C is on the terminal $T_1$, an averaged pulse of signals B and C generatd at the output of the averaging circuit $F_1$ is not allowed to pass through a gate circuit $G_1$, but the averaged pulse signal of the pulse signals A and B which are stored in a memory circuit $M_2$ reaches the terminal $T_2$ through a gate $G_2$ which has been turned "open" by the output signal $\alpha_1$ of the comparing circuit $C_1$. Further, if a detecting pulse signal D is impressed on the terminal $T_1$, the comparing circuit $C_1$ generates a second successive $\alpha$ signal, thereby causing the output of the circuit P to generate a signal for controlling the switching circuit S so as to connect the input $T_2$ of the switching circuit to the output terminal $I_2$. The output of the averaging circuit $F_2$ impress a pulse signal averaging the intensity of the input pulse D and the averaging pulse intensity of input pulses A and B stored in the memory circuit $M_3$ on the input terminal $T_2$ of the circuit S. Consequently, the pulse signals A to E as distributed in FIG. 3 are processed into the image signals A' to E' in FIG. 5 which are free of low frequency noise and have a minimum of micro fluctuation. Therefore, an image displayed by a signal which passes through such an image processing circuit is by far better than an image which requires no image processing circuit.

The detecting pulse signals V to Z as distributed in FIG. 3 are impressed on the input terminal $T_1$ of the image signal processing circuit in FIG. 4. When the pulse X is impressed, a pulse having the mean intensity of V and W appears at the terminal $T_2$ since the difference in intensity between the input pulses W and X is large. But when the next pulse Y is impressed, the difference in intensity between the pulses Y and X is so small that the comparing circuit $C_1$ generates no signal $\alpha$ the gate circuit $G_1$ is turned "open" and a pulse having the mean intensity of the pulses X and Y from the averaging circuit $F_1$ reaches the output terminal $T_2$ through the gate circuit $G_1$. In this way, the signal distribution of the input pulses V to Z in FIG. 3 is rearranged as V' to Z' in FIG. 5. Therefore, a sudden variation in a detecting pulse signal is reproduced with fidelity and unlike conventional image signal processing unit, the removal of a micro fluctuation of an image signal does not entail the danger of impairing a sudden signal variation inherent in an image signal.

Figure 6:
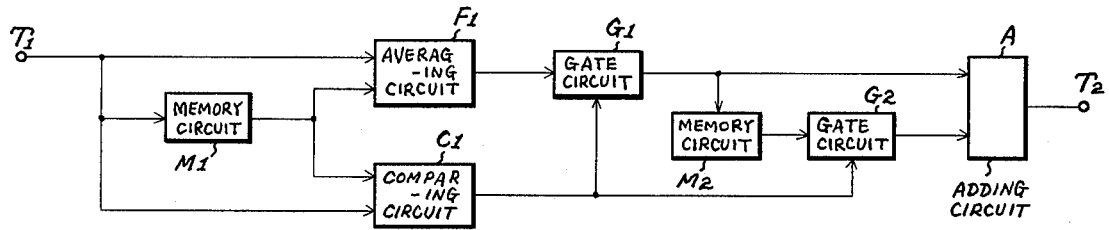
FIG. 6 is a block diagram of another processing circuit according to this invention; and, FIG. 7 is a chart of a video signal processed by the circuit shown in FIG. 6.
Figure 7:
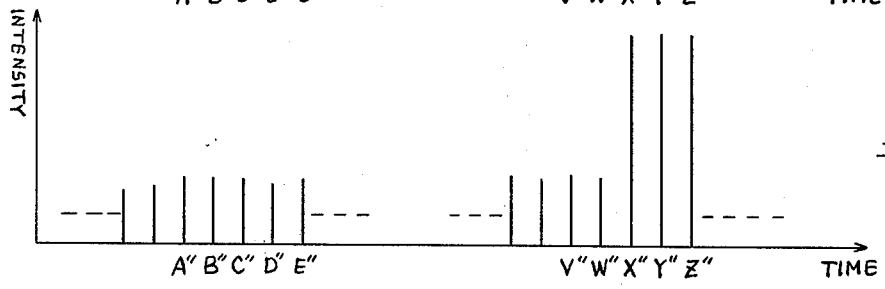

FIG. 6 is a schematic diagram showing the structure of a simplified embodiment of the image signal processing means illustrated in FIg. 4. In FIG. 6 and FIG. 4, each circuit code is identical, and A denotes an adding circuit. When an image signal pulse B is impressed on the input terminal $T_1$ as shown in FIG. 3, the comparing circuit $C_1$ generates no output signal and an output (A+B/2) of averaging circuit $F_1$ reaches the adding circuit A through the gate circuit $G_1$. In this case, only a signal (A+B/2) appears at the output terminal $T_2$ since the gate circuit $G_2$ is "closed." Then, when a pulse signal C is impressed on the input terminal $T_2$ the output from the comparing circuit C turns the gate circuits $G_1$ "close" and $G_2$ "open." Accordingly, only the pulse signal (A+B/2) stored in the memory circuit $M_2$ is impressed on the adding circuit A and it reaches $T_2$. Next, since the averaging circuit $F_1$ and the gate circuits $G_1$, $G_2$ remain unchanged if the pulse signal D is impressed on the input terminal $T_1$, the output signal (A+B/2) again reaches the output terminal $T_2$ through the adding circuit A. Then, when the pulse signal E is impressed on the input terminal $T_1$, again the gate circuit $F_1$ appears at the output terminal $T_2$. In this way, the input pulse signals A to E in FIG. 3 are derived from the output terminal $T_2$ as signals free of low frequency noise as shown by A" to E" in FIG. 7.

Further, in the case of the input pulses having time distribution V to Z in FIG. 3, when the pulse X is impressed on the terminal $T_1$, a signal (V+W/2) appears at the output terminal $T_2$ since the difference between the inputs W and X is large. Next, when the pulse Y is impressed on the terminal $T_1$, the signal (X+Y/2) generated from the averaging circuit F reaches the output terminal $T_2$ through the gate circuit $G_1$ and the adding circuit A. Accordingly, a sudden variation in input signals are reproduced at the output terminal $T_2$ with fidelity as shown by V'' to Z'' in FIG. 7.

In addition to the above, to further simplify the circuit in FIG. 6, it is possible to omit the averaging circuit $F_1$ and connect the input terminal T directly to the gate circuit G, in which case the output signal can be obtained by eliminating a low frequency noise from the input image signal.

The above description refers to one embodiment of this invention applied to a scanning electron microscope, but also is easily applicable to other apparatus handling video signals, and the same advantages as those of this invention can be obtained. For example, a specimen image which has been temporarily photographed by a scanning or conventional transmission type electron microscope can be converted into an electric signal by an optical means or the like and can be processed by an apparatus of this invention.

Having thus described the invention with the detail and particularity as required by the Patent Laws, what is desired protected by Letters Patent is set forth in the following claims.

I claim:

1. A scanning electron microscope incorporating a means for irradiating a specimen with an electron beam, a deflecting means for scanning the electron beam over the surface of said specimen, a detecting means for detecting the secondary electrons or the like emitted from the specimen as a result of electron beam impingement and producing a pulsed video signal indicative thereof, and a display means for displaying a scanning image of said specimen by using the pulsed output signal from said detecting means which is synchronized with said deflecting means, the improvement comprising a signal processing circuit located between said detecting means and display means for extracting noise pulses from the pulsed video signal comprising means for detecting the absolute value of the pulse height difference between successive pulses of said pulsed video signal and means for rejecting video pulse signals when the absolute value of the pulse height difference exceeds a selected value twice in succession.

* * * * *

UNITED STATES PATENT OFFICE
CERTIFICATE OF CORRECTION

PATENT NO. : 3,944,829
DATED : March 16, 1976
INVENTOR(S) : Masayuki Sato

It is certified that error appears in the above-identified patent and that said Letters Patent are hereby corrected as shown below:

Column 3 Line 48 "D-F" should read --D-E--.

Column 3 Line 62 "generatd" should read --generated--.

Signed and Sealed this

Twentieth Day of July 1976

[SEAL]

Attest:

RUTH C. MASON
*Attesting Officer*

C. MARSHALL DANN
*Commissioner of Patents and Trademarks*